(12) United States Patent
Himmer

(10) Patent No.: US 9,728,704 B2
(45) Date of Patent: Aug. 8, 2017

(54) THERMOELECTRIC MODULE

(71) Applicant: Behr GmbH & Co. KG, Stuttgart (DE)

(72) Inventor: Thomas Himmer, Reichenbach (DE)

(73) Assignee: MAHLE INTERNATIONAL GMBH, Stuttgart (DE)

( * ) Notice: Subject to any disclaimer, the term of this patent is extended or adjusted under 35 U.S.C. 154(b) by 0 days.

(21) Appl. No.: 14/444,082

(22) Filed: Jul. 28, 2014

(65) Prior Publication Data

US 2015/0034138 A1  Feb. 5, 2015

(30) Foreign Application Priority Data

Jul. 31, 2013 (DE) .......................... 10 2013 214 988

(51) Int. Cl.
| | |
|---|---|
| H01L 35/32 | (2006.01) |
| H01L 35/00 | (2006.01) |
| H01L 35/28 | (2006.01) |
| H01L 35/30 | (2006.01) |
| H01L 35/34 | (2006.01) |

(52) U.S. Cl.
CPC .............. *H01L 35/32* (2013.01); *H01L 35/00* (2013.01); *H01L 35/28* (2013.01); *H01L 35/30* (2013.01); *H01L 35/34* (2013.01)

(58) Field of Classification Search
CPC ......... H01L 35/34; H01L 35/30; H01L 21/70; H01L 35/00; H01L 35/32; H01L 23/10; H01L 25/04; H01L 2924/0002; H01L 35/28; F01N 5/02; F01N 5/025; F25B 21/02; F25B 2321/023; F02G 5/00; Y02T 10/166; Y02T 10/16; Y10T 29/49968; Y10T 29/49885

See application file for complete search history.

(56) References Cited

U.S. PATENT DOCUMENTS 6,002,081 A  12/1999 Sakuragi
6,083,770 A   7/2000 Sato et al.
(Continued)

FOREIGN PATENT DOCUMENTS

DE  199 46 700 A1  6/2000
DE  100 22 726 A1  6/2001
(Continued)

OTHER PUBLICATIONS

German Search Report, Application No. DE 10 2013 214 988.3, Jun. 24, 2014, 10 pgs.

*Primary Examiner* — Allison Bourke
*Assistant Examiner* — Michael Y Sun
(74) *Attorney, Agent, or Firm* — Paul D. Strain, Esq.; Strain & Strain PLLC

(57) ABSTRACT

The invention concerns a thermoelectric module with multiple thermoelectric elements, which are arranged spaced apart from one another, two thermoelectric elements being respectively electrically connected by means of a conductor bridge, an electrical insulation being arranged at least in certain portions on a side of the conductor bridge that is facing away from the thermoelectric element and/or on a side of the conductor bridge that is facing the thermoelectric element, the electrical insulation being arranged on the surface of the conductor bridge, the electrical insulation and the conductor bridge being thermomechanically decoupled.

13 Claims, 8 Drawing Sheets

(56) References Cited

U.S. PATENT DOCUMENTS

Figure 1:
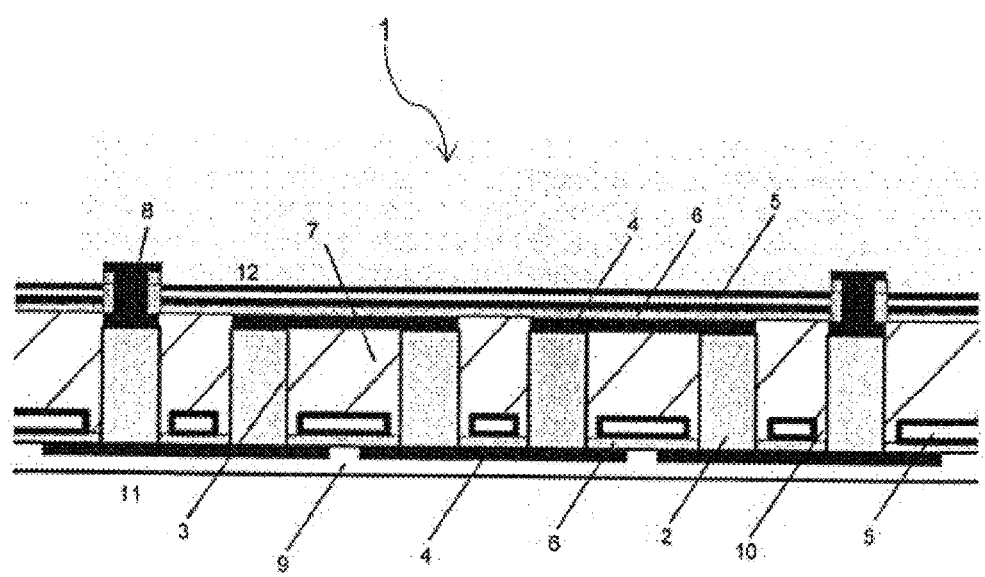

| | | | |
|---|---|---|---|
| 6,252,154 B1 | 6/2001 | Kamada et al. | |
| 6,274,803 B1 * | 8/2001 | Yoshioka | H01L 35/34 136/201 |
| 2006/0000500 A1 | 1/2006 | Sauciuc et al. | |
| 2006/0027257 A1 * | 2/2006 | Yamaguchi | F02B 63/04 136/203 |
| 2006/0042676 A1 | 3/2006 | Sogou et al. | |
| 2008/0163916 A1 * | 7/2008 | Tsuneoka | H01L 35/32 136/203 |
| 2009/0025770 A1 | 1/2009 | Lofy | |
| 2011/0146743 A1 * | 6/2011 | Oesterle | F01N 5/025 136/210 |
| 2012/0298163 A1 | 11/2012 | Brehm et al. | |
| 2013/0014796 A1 * | 1/2013 | Tajima | H01L 35/32 136/203 |
| 2014/0030611 A1 | 1/2014 | Pytlik et al. | |

FOREIGN PATENT DOCUMENTS

| | | | | |
|---|---|---|---|---|
| DE | 197 81 457 C2 | 11/2002 | | |
| DE | 10 2009 025 032 A1 | 12/2010 | | |
| DE | 10 2009 025 033 A1 | 12/2010 | | |
| DE | 10 2009 058 674 A1 | 6/2011 | | |
| DE | 10 2011 007 295 A1 | 10/2012 | | |
| JP | WO 2011118341 A1 * | 9/2011 | | H01L 35/08 |
| WO | WO 99/04439 A1 | 1/1999 | | |
| WO | WO 2011/054756 A1 | 5/2011 | | |

* cited by examiner

THERMOELECTRIC MODULE

CROSS-REFERENCE TO RELATED PATENT APPLICATIONS

This application is based upon and claims the benefit of priority from prior German Patent Application No. 10 2013 214 988.3, filed Jul. 31, 2013, the entire contents of which are incorporated herein by reference in their entirety.

TECHNICAL FIELD

The invention concerns a thermoelectric module with multiple thermoelectric elements, which are arranged spaced apart from one another, two thermoelectric elements being respectively electrically connected by means of a conductor bridge, an electrical insulation being arranged at least in certain portions on a side of the conductor bridge that is facing away from the thermoelectric element and/or on a side of the conductor bridge that is facing the thermoelectric element.

PRIOR ART

A thermoelectric device has at least one thermoelectric module, generally multiple thermoelectric modules, which respectively have at least one thermoelectric element, and is generally arranged between a heat source and a heat sink. In a thermoelectric generator (TEG), energy in the form of a voltage can be obtained by means of the thermoelectric device from a temperature difference between the heat source and the heat sink. Thermoelectric devices with at least one thermoelectric module may also be used as a heating device and/or cooling device. On account of its good efficiency, the thermoelectric device is better suited for this than for example resistance heaters, even those with a PTC element (positive temperature coefficient). In hybrid vehicles and/or battery-operated electric vehicles, the thermoelectric device is preferably used for heating and/or cooling the passenger compartment of the motor vehicle, since here the coolant-fed heating devices are not available on account of the lower coolant temperatures in comparison with a vehicle with an internal combustion engine. Since the stored electrical energy available must be used here as economically as possible, only electrical heating and/or cooling devices are available.

If the thermoelectric device is implemented in an exhaust gas line or an exhaust gas recirculation of a motor vehicle, the energy stored in the exhaust gas in the form of heat can be used during the operation of the motor vehicle to increase the efficiency of the motor vehicle and lower the $CO_2$ emissions. The thermoelectric device may convert part of the heat here into energy by means of the thermoelectric module (TEM) and supply it to the motor vehicle. On account of their construction, their design and the connection technique and coupling to the heat source and the heat sink, conventional thermoelectric modules are not optimally suitable for use in a motor vehicle and are not very effective as a result of low efficiency.

Various configurations of thermoelectric devices are known in the prior art, of which only some of the applicant's that are concerned with an improvement in the heat transmission between are to be mentioned at this point.

DE 10 2009 025 032 A1 shows a thermoelectric device that can be used between a heat source and a heat sink and a device for improved heat transmission. Here, the thermoelectric module of the thermoelectric device has multiple thermoelectric elements, which are arranged spaced apart from one another and next to one another in one plane. Improved heat transmission is realized here by ribs, which are arranged on the thermoelectric module on the side facing the heat source and/or heat sink.

DE 10 2009 025 033 A1 has a thermoelectric device that achieves an improved heat resistance by providing a kind of coupling between thermoelectric materials and an enveloping body, the configuration of which has a significant influence on the effectiveness of the thermoelectric module for use in a thermoelectric generator. The enveloping body is formed here as a main ceramic body and, at least in certain regions, has a metallization.

DE 10 2011 007 295 A1 has a thermoelectric device with thermoelectrically active elements, a liquid-metallic connector being arranged between contact areas of the thermoelectrically active elements and realizing a good connection between them.

DE 10 2009 058 674 A1 discloses a thermoelectric unit with multiple thermoelectric modules, which form a thermoelectric generator. The thermoelectric modules are arranged between an outer tube and an inner tube of a double-walled cooling tube and are electrically connected by a connector.

SUMMARY OF THE INVENTION, PROBLEM, SOLUTION, ADVANTAGES

The problem addressed by the invention is that of providing an improved thermoelectric module (TEM) and improved thermoelectric device that can be used between a heat source and a heat sink.

This is achieved by a thermoelectric module with the features of claim 1 and by a thermoelectric generator with the features of claim 14.

An exemplary embodiment of the invention concerns a thermoelectric module with multiple thermoelectric elements, which are arranged spaced apart from one another, two thermoelectric elements being respectively electrically connected by means of a conductor bridge, an electrical insulation being arranged at least in certain portions on a side of the conductor bridge that is facing away from the thermoelectric element and/or on a side of the conductor bridge that is facing the thermoelectric element, the electrical insulation being arranged on the surface of the conductor bridge, the electrical insulation and the conductor bridge being thermomechanically decoupled.

It is also advantageous if a filler material is respectively arranged between two thermoelectric elements and/or the volume between two thermoelectric elements is filled with a filler gas.

In addition, it is to be preferred if the electrical insulation is a coating or a ceramic substrate.

It is also expedient if the thermoelectric module has an enveloping body, which at least partially encloses as a housing the upper side and underside of the thermoelectric module, the enveloping body being of a one-part or multi-part form.

It is also advantageous if the enveloping body has at least one clearance for receiving at least one thermoelectric element.

It is also advantageous if the enveloping body has multiple clearances, through which a single thermoelectric element respectively protrudes, the end regions of the thermoelectric elements arranged outside the enveloping body being electrically connected by way of multiple conductor bridges, which are likewise arranged outside the enveloping body.

It is also to be preferred if, between the conductor bridges arranged outside the enveloping body and the adjoining area of the enveloping body, the electrical insulation is formed as a coating and/or electrically insulating adhesive.

In addition, it is expedient if the conductor bridges arranged outside the enveloping body and/or the electrical insulation is coated with an additional electrical insulation, which is suitable for protecting the conductor bridges from a fluid flowing past them. The fluid may in this case be for example a gas from a stream of exhaust gas.

It is also advantageous if the layer thickness of the electrical insulation is between 20 and 30 µm.

In addition, it is advantageous if the enveloping body has multiple clearances, a single thermoelectric element being respectively arranged completely in the interior space of the enveloping body, each clearance in the interior space being covered by a conductor bridge and an electrical insulation being arranged between a conductor bridge and the inner side of the enveloping body.

It is also to be preferred if the conductor bridge is formed as a graphite foil. The graphite foil is in this case preferably a metallized graphite foil, which is particularly thin and at the same time electrically conducting.

It is also advantageous if a barrier layer is applied to the thermoelectric elements.

In an alternative embodiment, it may be provided that a rib structure or profile structure is arranged on a surface of the insulation that is facing away from the conductor bridge.

An exemplary embodiment of the invention concerns a thermoelectric generator with multiple thermoelectric modules, the thermoelectric modules being electrically connected to one another.

The thermoelectric module (TEM) for use between a heat source and a heat sink has multiple thermoelectric elements with a thermoelectric material and conductor bridges, the multiple thermoelectric elements being arranged spaced apart from one another and the conductor bridges serving for the electrical connection of in each case two thermoelectric elements, a filler material being arranged between the thermoelectric elements, a thermoelectric decoupling element being provided. The thermoelectric decoupling element is preferably arranged on the heat source, which is also referred to as the hot side of the thermoelectric module. It may for example be formed by an electrical insulation.

The thermoelectric elements may be arranged and respectively connected to the conductor bridges in such a way that they are interconnected both as a parallel circuit and as a series circuit. The number of thermoelectric elements and their interconnection in the thermoelectric module are determined here by the intended electrical voltage that is necessary to generate at the output of the TEM. The thermoelectric elements are preferably electrically connected on the upper side and underside electrically by means of the conductor bridges, so that the thermoelectric elements are respectively arranged between a planes of conductor bridges, a conductor bridge preferably respectively connecting two thermoelectric elements and the conductor bridges not touching one another.

The thermoelectric elements arranged spaced apart do not touch one another and a filler material arranged between them is preferably electrically non-conducting or insulating or at least thermally poorly conducting.

The thermoelectric elements, formed as cuboids, are consequently surrounded on their side faces by the filler material. The filler material may be a filler gas, vacuum or a solid body, for example plastics material or a ceramic foam. The filler material may also serve the purpose of protecting the thermoelectric elements from oxidation or other media attacks and/or mechanically stabilizing or positioning the thermoelectric elements and mechanically supporting the structure of the TEM.

The electrical insulation is designed in such a way that the heat resistance in the thermoelectric module as a whole is kept as low as possible, the electrical insulation being respectively arranged at a region of the conductor bridge that is for example facing the heat source and/or the heat sink.

The heat resistance, which is also referred to as heat conducting resistance or thermal resistance, is a characteristic heat value and a measure of the temperature difference that is produced in an object when a flow of heat passes through it (heat per unit of time or heat output). The inverse value of the heat resistance is the heat conduction value of the component. The unit of the heat resistance is K/W.

The electrical insulating property of the electrical insulation has the effect that the electrons bringing about the electrical conductivity are hindered from passing over from the conductor bridge into the material of the heat source and the conductor bridge can be arranged directly on the heat source. The temperature transmission between the heat source and the thermoelectric element is brought about by means of phonons, which can pass through the preferably thin layer of the electrical insulation. Consequently, the electrical insulation represents a high electrical resistance, but no or only very low thermal resistance.

In a preferred exemplary embodiment, the electrical insulation forms a compact, but preferably thin layer, which may extend over certain portions on the side of the conductor bridges that is facing away from the thermoelectric elements. In certain portions, the electrical insulation may extend adjacent the filler material, in particular extend on the side of the filler material that is arranged on the hot side of the thermoelectric module.

The electrical insulation can be easily produced by one of the coating processes known per se, for example vapor depositing, PVD, CVD, printing, sintering, thermal spraying etc., and may comprise a ceramic material or a ceramic compound of various ceramic materials such as aluminum oxide, zirconium oxide or magnesium oxide, aluminum nitride, silicon or a glass, for example borosilicate glass.

In a preferred configuration of the thermoelectric module, the electrical insulating layer has a further coating and/or a ceramic element. The ceramic element may be a ceramic substrate here, that is to say a distinctly planar solid body, and be incorporated in the layer, in particular be surrounded at least in certain portions by the layer. The layer may also for example be produced by a masking coating process in certain portions from different electrically insulating materials, preferably ceramic materials or glasses, and consequently be made in certain portions of different electrically insulating materials or groups of materials. This may for example be an oxidic ceramic layer such as an aluminum oxide layer and a nitridic substrate such as an aluminum nitride substrate. Consequently, a composition of the electrical insulation that differs from portion to portion may be realized. An electrical insulation made up in this way is preferably able to absorb thermomechanical stresses. A thermomechanical decoupling between the thermoelectric element, the conductor bridge and the heat source can be realized in this manner. The basis for this is in particular the thin wall thickness of the electrical insulation, which is conducive to the absorption of thermomechanical stresses.

The electrical insulation may in this case be formed both by a coating and by a ceramic substrate.

An enveloping body may preferably be provided. The enveloping body may be a metallic enveloping body with an electrically insulating layer surrounding it that is embedded in the filler material and consequently creates a rigid holding structure. The volume requirement of the filler material is consequently precisely defined and restricted at least within certain regions.

Furthermore, the geometrical dimensions of the thermoelectric module as a whole may be defined by means of the enveloping body. The enveloping body may in this case enclose the thermoelectric module not only on its underside, but also on its upper side and also in the lateral region. The enveloping body may in this case be of a multipart configuration. The enveloping body may likewise be an interface with other components, for example the interface of a thermoelectric generator, a thermoelectric heater and/or cooler, and be assigned both to the respectively other component and to the thermoelectric module.

The enveloping body may be provided here at least on one side with clearances, which can be passed through by one or more thermoelectric elements and may protrude beyond the enveloping body on the outside. The enveloping body may preferably be provided with an electrically insulating coating on its outer surface, at least in certain portions, in order that no electrical contacting can occur between the adjacently arranged conductor bridges and the enveloping body. Better thermomechanical decoupling can be ensured by the separately configured enveloping body; in particular, connecting layers can be thermomechanically decoupled.

The clearances and the conductor bridges resting on the enveloping body allow the heat resistances to be reduced, without restricting the overall thermoelectrical efficiency of the thermoelectric module. At the same time, an altogether poorer thermal coupling can be realized between the adjacent thermoelectric elements and/or respectively between the thermoelectric element and the enveloping body and, and bypass heat flows over and through the enveloping body can be reduced.

The conductor bridges may be arranged here both in an embodiment lying on the inside or lying on the outside. In this case, they may be respectively arranged directly adjacent the thermoelectric element and the filler material. Seen in a vertical section, the enveloping body may in this case be arranged in a different line than the thermoelectric elements. In the case of an outside arrangement, the electrically insulating coating of the enveloping body is respectively arranged between the conductor bridge and the enveloping body. The enveloping body may also be replaced by a solid ceramic element, which is arranged between the thermoelectric elements in the region of the filler material.

In one configuration of the thermoelectric device, a graphite foil is provided, realizing the thermoelectric decoupling element. The graphite foil has here a metallic coating or metallization on both sides of the graphite foil. Here, the graphite foil forms the conductor bridge.

In a further configuration of the thermoelectric module, a barrier layer is provided on the thermoelectric elements. The barrier layer serves for protection from oxidation and/or protection from degradation. The barrier layer may be applied by means of a coating or sintering process known per se. The barrier layer is preferably applied laterally to the thermoelectric element, particularly preferably applied to the outer surfaces of the thermoelectric element that can come into contact with the filler material.

The electrical insulation, which is arranged on the hot side of the thermoelectric module, is preferably not formed mechanically as a one-piece coating with the ceramic substrate arranged on the cold side. The electrical insulation and the ceramic substrate on the cold side are two separate layers or systems of layers.

In a further configuration, the thermoelectric module has a rib structure, in particular on a surface of the electrical insulation. The rib structure is particularly advantageous if the thermoelectric device is coupled to a fluid. For example, in the case of installation in the exhaust gas line of a motor vehicle, the surface area along which the warm exhaust gas flows can be increased.

The problem is also solved by a thermoelectric device with at least one, preferably multiple thermoelectric modules according to one of the embodiments presented above and a thermoelectric generator for generating electrical energy from heat with a first thermoelectric module and at least one second thermoelectric module. The generation of electrical energy from thermal energy can be particularly efficient here, since a thermoelectric decoupling between the heat source and the thermoelectric modules is realized.

Further advantageous configurations are described by the following description of the figures and by the subclaims.

Figure 2:
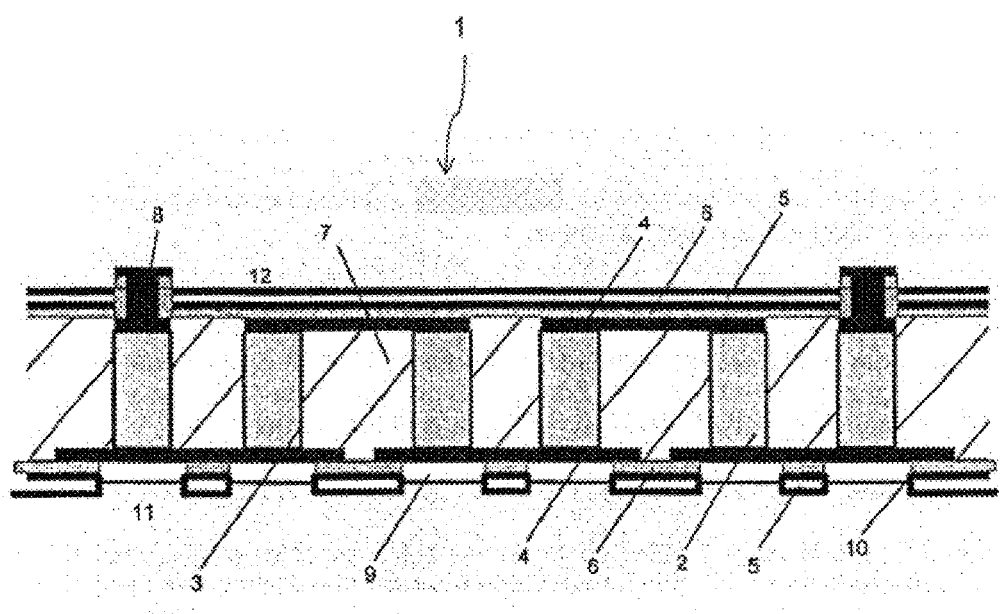
Figure 3:
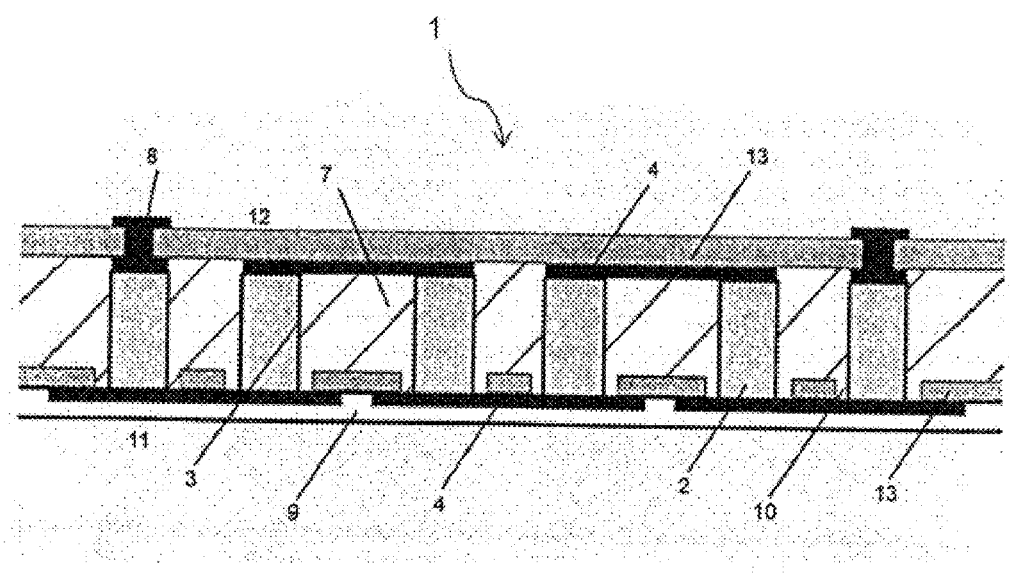
Figure 4:
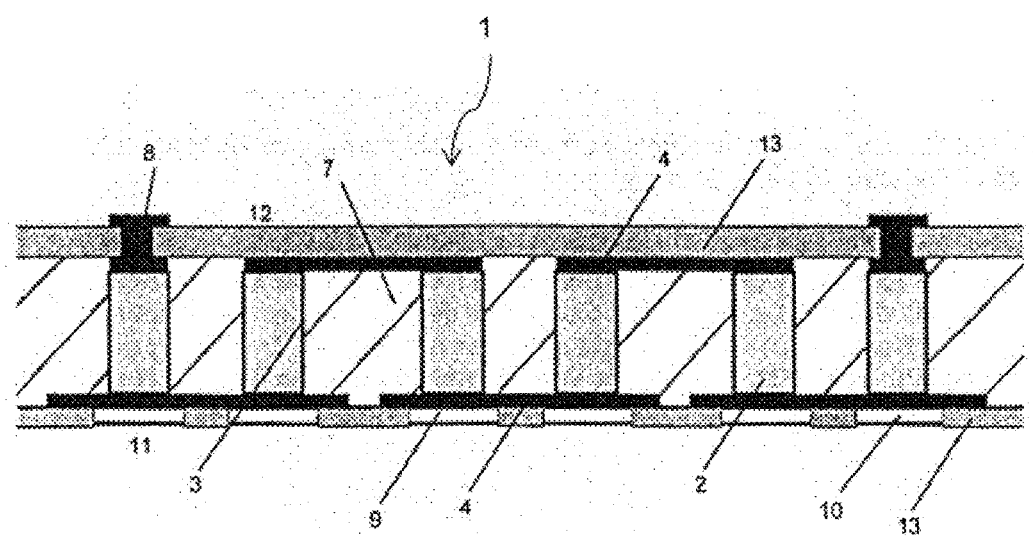
Figure 5:
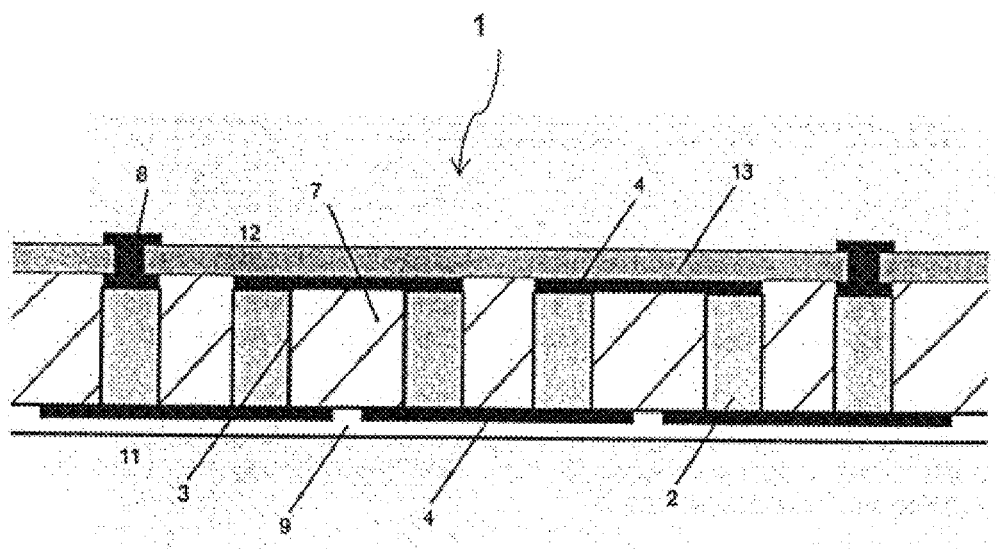
Figure 6:
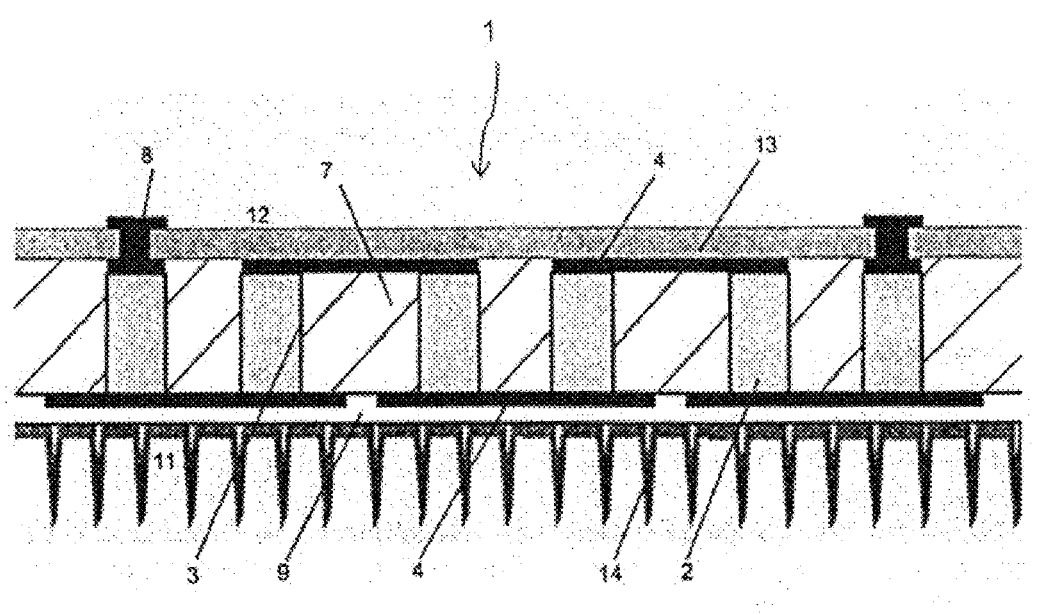
Figure 7:
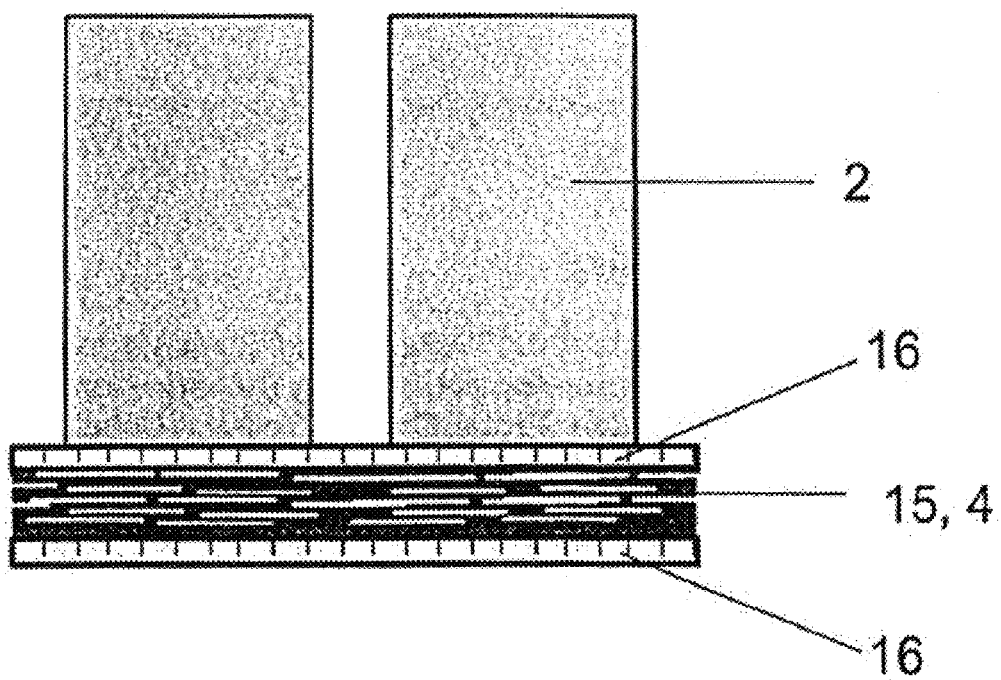
Figure 8:
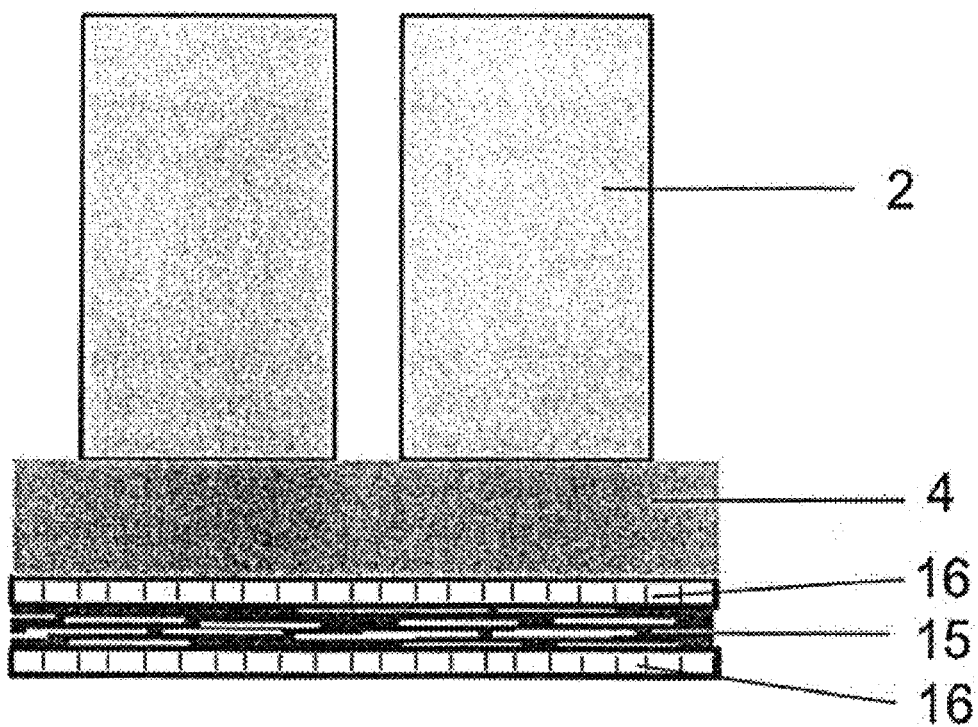

The invention is explained in more detail below on the basis of the exemplary embodiments with reference to the figures of the drawing, in which:

FIG. 1 shows a first exemplary embodiment of a thermoelectric module according to the invention, FIG. 2 shows a further exemplary embodiment of a thermoelectric module according to the invention, FIG. 3 shows a further exemplary embodiment of a thermoelectric module according to the invention, FIG. 4 shows a further exemplary embodiment of a thermoelectric module according to the invention, FIG. 5 shows a further exemplary embodiment of a thermoelectric module according to the invention, FIG. 6 shows a further exemplary embodiment of a thermoelectric module according to the invention, FIG. 7 shows a detail of a thermoelectric module with two thermoelectric elements with a graphite foil in a first embodiment, and FIG. 8 shows a detail of a thermoelectric module with two thermoelectric elements and a graphite foil in a second embodiment.

FIG. 1 shows a first exemplary embodiment of a thermoelectric module 1 according to the invention in a schematic representation as a longitudinal section. The thermoelectric module 1 has thermoelectric elements 2 arranged next to one another, which are arranged spaced apart from one another and in one plane. Here, pairs of p-doped and n-doped thermoelectric elements are always formed. The thermoelectric elements 2 comprise a thermoelectrically active material. The thermoelectric elements have a barrier layer 3, which may for example prevent oxidation and is preferably arranged on the lateral wall. The barrier layer 3 may be formed from a metallic element that has good inert properties, such as nickel, tantalum, tungsten, chromium or gold. The thermoelectric elements 2 may be connected to one another by conductor bridges 4 in such a way that they are interconnected in series or in parallel. A thermoelectrically active element 2 preferably comprises one of the following materials:

tellurides, for example a bismuth-tellurium-based material, a lead-tellurium-based material, or a silver-tellurium-based material, antimony-based materials, for example a cobalt-antimony-based material or a zinc-antimony-based material, selenides, for example PBSe, $Bi_2Se_3$, $K_2Bi_8S_{13}$ and other compounds that comprise selenium, oxides, for example $NoCoO_4$, $Ca_3CoO_9$, silicides, for example a manganese-silicide-based material, a magnesium-silicide-based material or an iron-silicide-based material or comprising a germanium-silicon compound, borides and carbides, for example $B_4C$, $CaB_6$, half-Heusler material, for example TiNiSn, HfPdSn, TI compounds, for example $TI_9BiTe_6$, Zintl phases such as $Yb_{14}MnSb_{11}$ silver compounds, such as $AgPbSbTe_{2+x}$ Most of the materials mentioned may take the form here of skutterudite or a superlattice or nano materials with dimensions in the range of nanometers.

The thermoelectrically active materials may be produced by processes known per se, such as for example a pressure-sintering process, spark-plasma sintering, powder metallurgically, by crystal growing processes or by zone melting processes. The thermoelectric element 2 may however also be a material produced by nano processes, which comprises nano wires or nano superlattices. An optimized production process may influence and improve the thermoelectric properties.

The thermoelectric elements 2 are connected to one another by means of conductor bridges 4, a p-doped thermoelectric element 2 and an n-doped thermoelectric element 2 being respectively connected on one side—either a hot side 11 or a cold side 12—by means of one of the conductor bridges 4. The p-doped thermoelectric element 2 for example is connected to the thermoelectric element 2 arranged adjacently on the other side on the other side—corresponding to the cold side 12 or the hot side 11—by means of one of the conductor bridges 4. What is meant here by the hot side 11 is the side of the thermoelectric element 2 that is for example facing the hot stream of exhaust gas, and what is meant by the cold side 12 is the side of the thermoelectric element 2 that is not facing the elevated temperature. The contacting between the thermoelectric element 2 and the conductor bridge may take place for example by means of soldering or brazing or by means of related processes. Other processes, such as laser-beam welding, plasma TIG welding or cold-metal transfer welding, may also be used, to name just a few. Adhesive-bonding processes can also be used. The conductor bridges 4 are preferably formed from copper, aluminum, silver, nickel, chromium or tin and are electrically conducting. A conducting graphite foil may likewise be used as the conductor bridge 4 (see in this respect the description in relation to FIGS. 7 and 8). The conductor bridges 4 may be configured as solid bodies, for example sheet-metal strips, or be applied to the thermoelectric element 2 as a coating. The coating may for example be vapor-deposited.

The thermoelectric module 1 is preferably coupled differently to the hot side 11 and the cold side 12. On the cold side 12 there is formed an enveloping body 5, which forms a continuous element. The enveloping body 5 is preferably made of a metallic material. In order to insulate the conductor bridges 4 from the enveloping body 5, a layer 6, which is an electrically insulating layer 6, is applied in between. The layer 6 may surround the enveloping body 5 in certain portions or completely, in order to insulate it electrically. Materials for the layer 6 are for example ceramic materials, such as aluminum oxide, zirconium oxide, magnesium oxide, zirconium-reinforced aluminum nitride, silicon nitride, silicon oxide, aluminum nitride, silicon, boron oxide, calcium oxide, glass, borosilicate glass or glass solder. These materials are all electrically insulating and have different heat conduction coefficients, which lie between 2 [W/mK] (silicate ceramic) and 240 [W/mK] (aluminum nitride), and also different thermal expansion coefficients, which lie between 1 [$1/10^5$K] (silicate ceramic) and 13 [$1/10^5$K] (MgO). Consequently, the material best suited for the layer 6 can be chosen according to the system and system parameters (temperature of the heat source for example).

Respectively arranged between the thermoelectric elements 2 is a filler material 7, which is electrically insulating and thermally insulating or at least thermally poorly conducting. Here, the filler material 7 and the thermoelectric element 2 are arranged in one plane. The filler material is preferably a poly-bis-maleinimide or phenolic resin or a silicon-based higher-temperature-resistant plastic, an embedding compound or adhesive. It may also be a coated CRP material, a silica gel, a silicon material (pyrogenic $SiO_2$), a silicate foam or an aerogel-silicate material. Expanded glass or foam glass, diatomaceous earth, vermiculite, perlite, lightweight refractory bricks and lightweight silicate bricks as well as lightweight zirconium bricks and lightweight corundum bricks can also be used. Calcium-silicate materials, cordierite, mullite, celsians, hard porcelain, mineral sponges, ceramic sponges and mats as well as reinforced HT insulant may be used according to the application area and area of use of the TEM 1. An arrangement of vacuum or inert gas or air for the insulation of the thermoelectric elements 2 from one another is also conceivable.

On the cold side 12, plated-through holes 8 are provided, by means of which the thermoelectric module 1 can be connected to an electric circuit (not represented). The plated-through holes 8 consequently serve for the electrical connection of the thermoelectric module 1 and the thermoelectric device 10. The plated-through holes 8 may be connectors, rivets or pins and are produced from an electrically conducting material.

Hereinafter, the designation thermoelectric decoupling element may mean both an electrically insulating layer and a thermomechanical decoupling element. The thermoelectric decoupling element may in this case be formed for example as a coating or be formed as a ceramic substrate. The respectively applicable properties are described in more detail in the corresponding paragraphs.

Arranged on the hot side 11 of the embodiment of the thermoelectric module 1 represented in FIG. 1 is a thermoelectric decoupling element 9, which at least in certain portions is arranged directly adjacent the conductor bridges 4. The thermoelectric decoupling element 9 has the task of electrically insulating the conductor bridge 4 from the with respect to the material from which heat is to be extracted, for example the stream of exhaust gas. The thermoelectric decoupling element 9 in this case does not have a great heat resistance. To enhance the effect of the thermoelectric decoupling element 9, a portion of the enveloping body 5 is additionally arranged in the region respectively between the conductor bridges 4. The layer 6 covers here an intermediate space between the thermoelectric elements 2 virtually completely. The enveloping body 5 is consequently surrounded in certain portions by the layer 6.

The thermoelectric decoupling element 9 is preferably a coating 9 applied to the conductor bridges that is electrically insulating. The thermoelectric decoupling element 9 may consist of an oxide ceramic, for example aluminum oxide, zirconium oxide, zirconium-reinforced aluminum oxide, silicon oxide, magnesium oxide, calcium and sodium oxide, a nitride ceramic, for example aluminum nitride, silicon nitride, a glass, for example borosilicate glass or a glass solder, or comprise one of the materials mentioned. The material for the thermoelectric decoupling element 9 is preferably chosen here according to the operating temperature, since the heat conduction coefficients λ are temperature-dependent.

The thermoelectric decoupling element 9 can preferably be applied as a coating to the mounted thermoelectric module 1 by means of a coating process known per se, in particular a thin-film process such as PVD, CVD, PECVD, LPCVD, C-CVD. It is also possible, however, that it can be applied by anodizing, spraying, plastification, dip coating, enameling, glazing, sealing, electroplating, spin coating or sol-gel coating, thermal oxidation of silicon or soldering/brazing.

At least in the respective portion between the thermoelectrically active elements 2, the enveloping body 5 has a clearance 10. The clearance 10 is respectively passed through by the thermoelectric element 2. Consequently, the clearances 10 may be arranged around the enveloping body 5 in such a way that the thermoelectric elements 2 do not touch the respective enveloping bodies 5. Consequently, the thermoelectric element 2 and the connecting bridge 4 is thermomechanically protected on the one hand by the thermoelectric decoupling element 9 and on the other hand by the enveloping body 5, which is electrically insulated by the layer 6 and has the clearances 10. On account of the clearances 10 and the layer 6 respectively arranged on the enveloping body 5 on its side facing the cold side 12 and the hot side 11, the conductor bridges 4 may rest on the enveloping body 5 on the outer side thereof and respectively reduce the heat resistances with respect to the thermoelectric material 2. This leads to a potential capability of the thermoelectric module 1. At the same time, a poor thermal coupling is realized by the clearance 10 and bypass heat flows over and through the enveloping body 5 can be reduced. As an alternative to the coating of the enveloping body 5, the layer 6 may also be applied to the filler material 7. The clearances 10 are preferably arranged on the hot side 11, since different thermal expansions of the materials of the thermoelectric module 1 may occur on the cold side 12 and the hot side 11. Although a thermoelectric decoupling element 5+6+10 is realized by the coated enveloping body 5 together with the clearances 10, an additional coating 9 is arranged on the hot side 11 and/or the cold side 12 in order to shield the conductor bridges 4 with respect to the medium, for example hot exhaust gas. This also allows short-circuits between conductor bridges 4 arranged next to one another to be prevented. The coating 9 covers both the conductor bridges 4 and the coating 6 of the enveloping body 5 and is in direct contact with the hot side 11 and/or the cold side 12.

FIG. 2 shows a second embodiment of the thermoelectric module 1 in a schematic sectional representation. Identical items are designated by the same reference numerals. Here, the enveloping bodies 5 are arranged within the thermoelectric decoupling element 9, the layer 9. The layer 6, which insulates the enveloping bodies 5 from the conductor bridges 4, is arranged between the enveloping bodies 5 and the conductor bridges. Consequently the thermoelectric decoupling element has the layers 9 and 6 and the enveloping body 5. The conductor bridges 4 are as it were arranged on the inside. As a difference from the embodiment from FIG. 1, the clearances 10 are arranged in the region of the thermoelectric elements 2, which here do not pass through the clearances 10. A further difference from the embodiment of FIG. 1 is that the layer 9 touches the enveloping bodies 5, that is to say is in contact with them, and together with the layer 6 covers them in each case in certain portions.

FIG. 3 shows an embodiment of the thermoelectric module 1 from FIG. 1 in which the enveloping body 5 with the layer 6 is replaced by a preferably ceramic substrate 13. The function of the shaping for the filler material 7 is the same. The ceramic substrate 13 is arranged lying inside on the hot side 11 and protrudes into the filler material 7. The ceramic substrate 13 is arranged directly on the conductor bridges 4. On the cold side 12, the ceramic substrate 13 is a preferably continuous layer or an element 13 in the form of a layer. The ceramic substrate 13 may be an aluminum oxide or aluminum nitride, a silicon nitride, a zirconium oxide or cordierite, celsian, hard porcelain or magnesium oxide. Here, thermoelectric decoupling elements 13 with heat conduction coefficients of between 5 [W/mK] for silicon nitride and 260 [W/mK] for aluminum nitride can be realized with different mechanical properties, such as the thermal expansion coefficient and the flexural strength.

FIG. 4 shows the exemplary embodiment from FIG. 2 with ceramic substrates 13 lying on the outside on the hot side 11. The side of the thermoelectric module 1 that is facing the cold side 12 has a continuous, preferably one-piece ceramic substrate 13. The ceramic substrates 13 may be produced both as a ceramic layer by coating processes known per se or be applied as ceramic components 13. The ceramic substrates 13 preferably take the form of a solid element and are connected to the conductor bridges 4 by connecting techniques known per se.

FIG. 5 shows in a schematic representation an embodiment of the thermoelectric module 1 which has the layer 9, in which the conductor bridges 4 are preferably embedded, on the hot side 11 as a thermoelectric decoupling element. Here, the thermoelectric decoupling element 9 is preferably applied as a coating to the conductor bridges 4 and the filler material 7. An electrically insulating compound, preferably a ceramic compound, is provided as the material. The material of the ceramic substrate 13 on the cold side 12 may be identical here to the material of the thermoelectric decoupling element 9 or the thermoelectric decoupling coating 9 or different from it. The conductor bridges 4 rest directly on the filler material 7 and the intermediate spaces between the conductor bridges 4 in the horizontal plane are filled by the layer 9, that is to say the thermoelectric decoupling element 9. The side of the thermoelectric decoupling element 9 that is facing the exhaust gas may preferably be configured here as a planar surface area.

All of the embodiments of the thermoelectric module 1 may have a rib structure or profile structure 14 arranged on the thermoelectric decoupling element 9. This is represented in FIG. 6 by way of example for the embodiment of the thermoelectric module 1 from FIG. 5. Since, as part of the thermoelectric decoupling element 9, 5+6+10+9, 13+9, the layer 9 is facing the hot side 11 and in contact with it in all of the embodiments, the rib structure or profile structure 14 is arranged on the layer 9 and connected to it.

As a departure from the previously described embodiments of the thermoelectric module 1, the conductor bridge 4 may be provided with the layer 6 in addition to and/or instead of the enveloping body 5. It may also be provided that the ceramic substrate 13 is arranged as a ceramic coating 13 directly on the conductor bridges and/or is applied to them. The material-bonded connection may take place here for example by active metal brazing. This makes it possible to compensate for relative movements between the components of the thermoelectric module 1 that are caused by different thermal expansions. These relative movements generally occur between the conductor bridge 4 on the one hand and the enveloping body 5, the ceramic substrate 13 or the filler material 7 on the other hand.

FIG. 7 shows a detail of a thermoelectric module 1 with two thermoelectric elements 2 and a layer 15 of graphite, which is formed as a graphite foil 15. The graphite foil 15 has in the embodiment shown in FIG. 7 an electrical conductivity that is great enough for the graphite foil 15 to be used as a conductor bridge 4. The graphite foil 15 is metallized on both sides and has a metallic layer 16 on both sides, in order to ensure a better material-bonded connection between the thermoelectric elements 2. The metal layer 16 on the graphite foil 15 may for example be respectively soldered or brazed to the thermoelectric element 2.

FIG. 8 shows a detail of a thermoelectric module 1 with two thermoelectric elements 2, a graphite foil 15 with metal layers 16 on both sides and a conductor bridge 4 arranged between the metal layer 16 that is facing the thermoelectric element 2 and the thermoelectric element 2. The metal layer 16 that is facing the thermoelectric element 2 may also be omitted here. Here, graphite foils 15 with a low electrical conductivity may be used. In this case, the graphite foil has the function of the thermoelectric decoupling element 9.

All of the thermoelectric modules 1 shown in FIGS. 1 to 8 can be used in fluidic surroundings, which may be a gas, in particular a hot gas, for example exhaust gas, air, coolant, oil, acid. The thermoelectric module 1 may also be used in a solid body such as aluminum, steel, copper or ceramic.

A thermoelectric generator generally has multiple thermoelectric modules 1, which are preferably present in one of the embodiment shown in FIGS. 1 to 8 and can for example generate electrical energy from the heat of an exhaust gas.

Another thermoelectric device with thermoelectric modules 1 may be a cooling or heating device.

The invention claimed is:

1. A thermoelectric module with multiple thermoelectric elements, which are arranged spaced apart from one another,
   wherein two thermoelectric elements are respectively electrically connected by a conductor bridge,
   wherein an electrical insulation is arranged at least in certain portions on a side of the conductor bridge that is facing away from the thermoelectric element and/or on a side of the conductor bridge that is facing the thermoelectric element, wherein the electrical insulation is arranged on the surface of the conductor bridge, wherein the electrical insulation and the conductor bridge are thermomechanically decoupled,
   wherein a filler material is respectively arranged between two thermoelectric elements and/or the volume between two thermoelectric elements is filled with a filler gas,
   wherein a thermoelectric decoupling element is arranged on an outer surface of a hot side and on an outer surface of a cold side of the thermoelectric module,
   wherein a metallic enveloping body at least partially encloses an upper side and an underside of the multiple thermoelectric elements in an interior space, wherein the enveloping body has multiple clearances, wherein at each clearance an end region of a thermoelectric element projects through said clearance from the interior space into an exterior space outside of the enveloping body,
   wherein a side of the electrical insulation opposite the conductor bridge is adjacent to the enveloping body such that the enveloping body is insulated from the conductor bridge,
   wherein the conductor bridge is arranged in the exterior space outside of the enveloping body.

2. The thermoelectric module according to claim 1, wherein the electrical insulation is a coating or a ceramic substrate.

3. The thermoelectric module according to claim 1, wherein the enveloping body has multiple clearances, through which a single thermoelectric element respectively protrudes, wherein an end region of said single thermoelectric element is arranged outside the enveloping body being electrically connected by way of multiple conductor bridges, wherein the multiple conductor bridges are likewise arranged outside the enveloping body.

4. The thermoelectric module according to claim 3, wherein between the conductor bridges arranged outside the enveloping body and an adjoining area of the enveloping body, the electrical insulation is formed as a coating and/or electrically insulating adhesive.

5. The thermoelectric module according to claim 3, wherein the conductor bridges arranged outside the enveloping body and/or the electrical insulation is coated with an additional electrical insulation, which is suitable for protecting the conductor bridges from a fluid flowing past them.

6. The thermoelectric module according to claim 1, wherein the layer thickness of the electrical insulation is between 20 and 30 μm.

7. The thermoelectric module according to claim 1, wherein the enveloping body has multiple clearances, a single thermoelectric element being respectively arranged completely in the interior space of the enveloping body, each clearance in the interior space being covered by a conductor bridge and an electrical insulation being arranged between a conductor bridge and the inner side of the enveloping body.

8. The thermoelectric module according to claim 1, wherein the conductor bridge is formed as a graphite foil.

9. The thermoelectric module according to claim 1, wherein a barrier layer is applied to the thermoelectric elements.

10. The thermoelectric module according to claim 1, wherein a rib structure or profile structure is arranged on a surface of the insulation that is facing away from the conductor bridge.

11. A thermoelectric generator, comprising:
    multiple thermoelectric modules according to claim 1, wherein the thermoelectric modules are electrically connected to one another.

12. The thermoelectric module according to claim 1, wherein the filler material is a filler gas.

13. The thermoelectric module according to claim 1, wherein the thermoelectric decoupling element is an electrically insulating layer.

* * * * *